(12) United States Patent
Söderlund et al.

(10) Patent No.: US 10,385,450 B2
(45) Date of Patent: Aug. 20, 2019

(54) METHOD OF COATING A SUBSTRATE AND AN APPARATUS

(71) Applicant: BENEQ OY, Espoo (FI)

(72) Inventors: Mikko Söderlund, Espoo (FI); Pekka Soininen, Espoo (FI); Paavo Timonen, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 16/311,216

(22) PCT Filed: Jun. 30, 2017

(86) PCT No.: PCT/FI2017/050496
§ 371 (c)(1),
(2) Date: Dec. 19, 2018

(87) PCT Pub. No.: WO2018/002449
PCT Pub. Date: Jan. 4, 2018

(65) Prior Publication Data
US 2019/0186011 A1      Jun. 20, 2019

(30) Foreign Application Priority Data

Jun. 30, 2016    (FI) ..................................... 20165541

(51) Int. Cl.
*C23C 16/455* (2006.01)
(52) U.S. Cl.
CPC .. *C23C 16/45542* (2013.01); *C23C 16/45502* (2013.01); *C23C 16/45544* (2013.01)
(58) Field of Classification Search
CPC ........ C23C 16/45542; C23C 16/45502; C23C 16/45544
See application file for complete search history.

(56) References Cited

U.S. PATENT DOCUMENTS

2007/0090091 A1    4/2007 Adomaitis
2008/0241387 A1*  10/2008 Keto ..................... C23C 16/452
                                                                427/255.394
(Continued)

FOREIGN PATENT DOCUMENTS

EP     1703552 A2 *   9/2006   ........... C23C 16/045
EP     1703552 A2     9/2006

OTHER PUBLICATIONS

Written Opinion of the International Searching Authority issued by the Finnish Patent and Registration Office acting as the International Searching Authority in relation to International Application No. PCT/FI2017/050496 dated Oct. 30, 2017 (6 pages).

(Continued)

*Primary Examiner* — Kelly M Gambetta
(74) *Attorney, Agent, or Firm* — Robert P. Michal, Esq.; Carter, DeLuca & Farrell LLP

(57) ABSTRACT

A method and an apparatus for coating a substrate by subjecting a surface of the substrate to successive surface reactions of a first precursor and a second precursor in a reaction chamber. The method includes the steps of arranging the substrate to the substrate support in the reaction zone; supplying a predetermined amount of the first precursor to the reaction chamber for providing a flow of the first precursor to the reaction zone; supplying the second precursor for providing a flow of the second precursor through the reaction zone and discharging the second precursor from the reaction chamber, the second precursor being inactive to react with the first precursor; generating plasma discharge to the reaction zone for forming active precursor radicals from the second precursor supplied into the reaction zone, the active precursor radicals being active to react with the first precursor.

13 Claims, 2 Drawing Sheets

(56) References Cited

U.S. PATENT DOCUMENTS

2014/0120737 A1* 5/2014 Swaminathan ... C23C 16/45527
438/765
2015/0031157 A1 1/2015 Elam et al.

OTHER PUBLICATIONS

International Search Report issued by the Finnish Patent and Registration Office acting as the International Searching Authority in relation to International Application No. PCT/FI2017/050496 dated Oct. 30, 2017 (4 pages).

* cited by examiner

METHOD OF COATING A SUBSTRATE AND AN APPARATUS

CROSS-REFERENCE TO RELATED APPLICATIONS

This application is a National Phase entry under 35 U.S.C. 371 of PCT International Application No. PCT/FI2017/050496 filed Jun. 30, 2017, which claims priority to Finnish Patent Application No. 20165541, filed Jun. 30, 2016, the disclosure of each of these applications is expressly incorporated herein by reference in their entirety.

BACKGROUND OF THE INVENTION

Atomic layer deposition (ALD) is conventionally carried out in a reaction chamber under vacuum conditions. One or more substrates are first loaded into the reaction chamber and then vacuum is evacuated into the reaction chamber and the reaction space inside the reaction chamber is heated to process temperature. The atomic layer deposition is then carried out by supplying at least first and second gaseous precursors into the reaction chamber alternatingly and repeatedly for providing a coating layer with desired thickness on the surface of the substrate. A full ALD cycle, in which the first and second precursor are supplied into the reaction chamber comprises: supplying a pulse of first precursor into the reaction chamber, purging the first precursor from the reaction chamber, supplying a pulse of second precursor into the reaction chamber and purging the second precursor from the reaction chamber. Purging precursors may comprise discharging the precursor material from the reaction chamber, supplying purge gas, such as nitrogen, into the reaction chamber and discharging the purge gas. When desired number of ALD cycles and thus a desired coating layer thickness is reached, the vacuum in the reaction chamber is vented and the substrates are unloaded from the reaction chamber. Then the same process is repeated for the next substrates.

ALD process can be modified by applying plasma to the deposition cycle, this is called plasma-enhanced ALD (PEALD). Typical plasmas used during plasma-assisted ALD are those generated in $O_2$, $N_2$, $H_2$ or $CO_2$ reactant gases or combinations thereof. In PEALD, the surface to be coated or treated with ALD is exposed to the species generated by a plasma of the reactant gas or mixture of gasses during the reactant step (=one ALD half cycle). Plasma may be capacitively created plasma in which two electrodes are placed within a small distance from each other, one of the electrodes is connected to an RF power supply and the other is grounded. Thus plasma is ignited between the electrodes. In plasma mode an electric discharge is subjected to one of the precursors such that active precursor radicals, ions, are formed from the precursor. The active precursor radicals react on the surface of the substrate during an ALD cycle.

Plasma may be created as so called remote plasma in which the active precursor radicals are formed with plasma electrodes far away from the substrate and outside of the reaction chamber. The plasma comprising the active precursor radicals is then conveyed and pulsed into the reaction chamber in a conventional manner of pulsing precursors successively. The disadvantage of remote plasma is that the life time of the active precursor radicals is very limited, typically seconds. When the active precursor radicals are conveyed from distance to the reaction chamber or to the substrate the active precursor radicals tend to lose their reactivity and to be become deactivated. When the active precursor radicals become deactivated they do not react on the surface of the substrate and thus the efficiency of the ALD coating process is decreased.

Alternatively plasma may be created as so called direct plasma in which the substrate is arranged between the plasma electrodes and the plasma discharge is arced through the substrate. In this case the plasma is ignited in the reaction space between the plasma discharge electrode coupled to RF power supply and the substrate.

Problem with prior art ALD apparatuses is that when the precursors meet each other they create film in any surface not only to the substrate to be coated. This means that film is created to the surfaces of the apparatus and this leads to an increase need of cleaning which further leads to interruptions in use and increases coating process downtime.

BRIEF DESCRIPTION OF THE INVENTION

An object of the present invention is thus to provide a method and an apparatus for implementing the method so as to solve overcome the above problems. The objects of the invention are achieved by a method and an apparatus which are characterized by what is stated in the independent claims. The preferred embodiments of the invention are disclosed in the dependent claims.

The invention is based on the idea of preventing contamination of the apparatus elsewhere than in the area in which the coating is applied to the surface of the substrate. In other words the idea is to provide a specific area in which the precursors meet so as to create a coating to the surface of the substrate so that other parts of the apparatus stay clean.

The invention relates to a method of coating a substrate by subjecting a surface of the substrate to successive surface reactions of a first precursor and a second precursor according to the principles of atomic layer deposition in a reaction chamber. The reaction chamber comprises a first end having a gas inlet for providing precursor to the reaction chamber, a second end having a gas outlet for discharging precursor from the reaction chamber, a substrate support for holding the substrate, an opposing wall opposite to the substrate support, the substrate support and the opposing wall extending between the first end and the second end, a reaction space inside the reaction chamber defined between the first end and the second end and between the substrate support and the opposing wall, a plasma discharge electrode provided in connection with the opposing wall between the first end and the second end at a first distance from the first end and at a second distance from the second end and a reaction zone provided between the first distance from the first end and the second distance from the second end and between the plasma discharge electrode and the substrate support.

The method according to the invention comprises steps of arranging the substrate to the substrate support in the reaction zone; supplying a predetermined amount of the first precursor via the gas inlet to the reaction chamber for providing a flow of the first precursor to the reaction zone such that the first precursor is depleted by the end of the second end; supplying the second precursor via the gas inlet to the reaction chamber for providing a flow of the second precursor through the reaction zone and discharging the second precursor from the reaction chamber via the gas outlet, the second precursor being inactive to react with the first precursor; and generating plasma discharge to the reaction zone with the plasma discharge electrode for forming active precursor radicals from the second precursor supplied into the reaction zone during the flow of the second precursor through the reaction zone, the active precursor radicals being active to react with the first precursor.

The invention further relates to an apparatus for coating a substrate by subjecting a surface of the substrate to successive surface reactions of a first precursor and a second precursor according to the principles of atomic layer deposition in a reaction chamber. The apparatus comprises said reaction chamber and the reaction chamber comprises a first end having a gas inlet for providing precursor to the reaction chamber, a second end having a gas outlet for discharging precursor from the reaction chamber, a substrate support for holding the substrate, an opposing wall opposite to the substrate support, the substrate support and the opposing wall extending between the first end and the second end, a reaction space inside the reaction chamber defined between the first end and the second end and between the substrate support and the opposing wall, a plasma discharge electrode provided in connection with the opposing wall between the first end and the second end at a first distance from the first end and at a second distance from the second end, and a reaction zone provided between the first distance from the first end and the second distance from the second end and between the plasma discharge electrode and the substrate support. The apparatus further comprises a sacrificial member arranged in the reaction chamber in an area between the reaction zone and the second end for detecting concentration of the first precursor.

An advantage of the method and the apparatus of the invention is that the interruptions in use are reduced since for example the precursor supply channels are not contaminated because the precursors do not meet or react in that discharge area of the apparatus.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
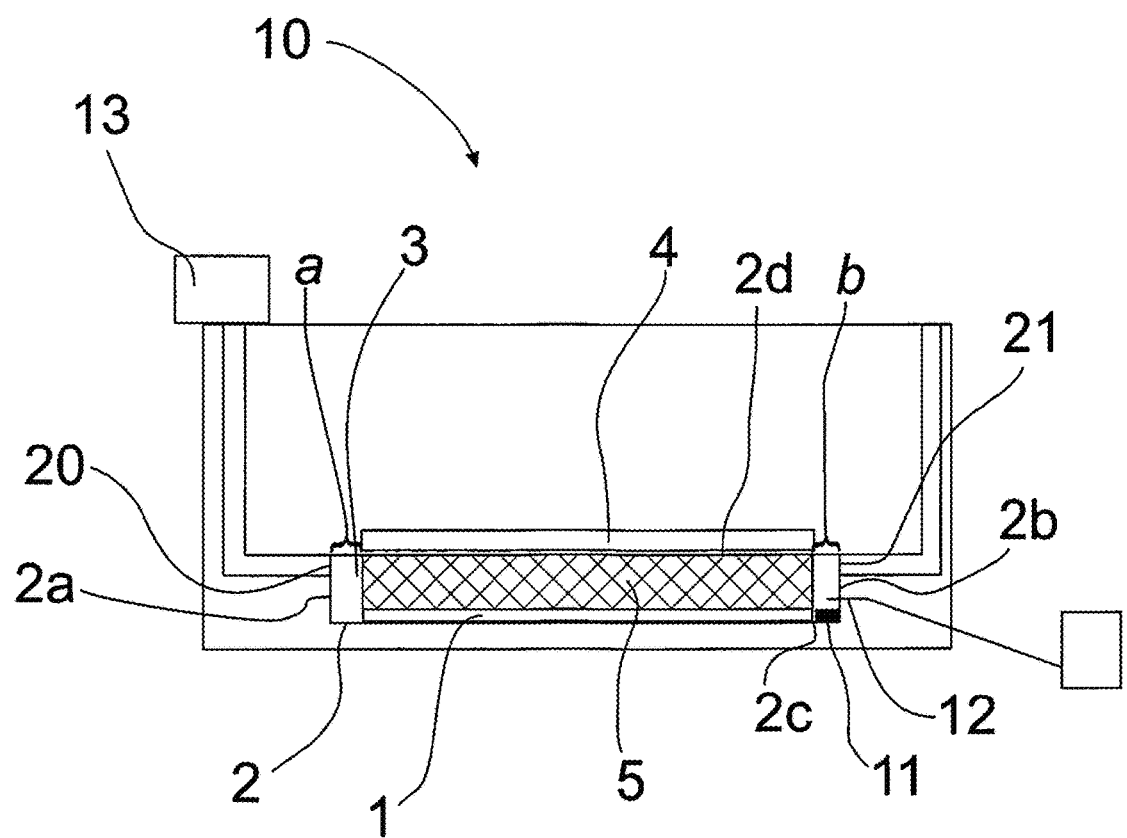
FIG. 1 shows a first embodiment of the apparatus for coating a substrate according to the invention.

FIG. 1 shows an apparatus 10 comprising a reaction chamber 2 and the reaction chamber 2 comprising a first end 2a having a gas inlet 20 for providing precursor to the reaction chamber 2, a second end 2b having a gas outlet 21 for discharging precursor from the reaction chamber 2, a substrate support 2c for holding a substrate 1, an opposing wall 2d opposite to the substrate support 2c, the substrate support 2c and the opposing wall 2d extending between the first end 2a and the second end 2b. The reaction chamber 2 is preferably low in height and wide in length which means that the reaction chamber is flat-like in a horizontal direction. The gas inlet 20 is preferably arranged such that the precursor supplied through the gas inlet 20 is directed to the reaction chamber 2 in a substantially horizontal flow direction and the gas outlet 21 is also preferably arranged such that the precursor discharged from the reaction chamber 2 is discharged in a substantially horizontal flow direction. The gas inlet 20 and the gas outlet 21 are arranged such that the flow direction of the precursors flowing through the reaction chamber 2 is substantially horizontal. The substrate support 2c may be the bottom of the reaction chamber 2 or a separate substrate support arranged on the bottom of the reaction chamber 2 or a separate substrate support arranged on the top part of the reaction chamber 2. In FIG. 1 the substrate support 2c is the bottom of the reaction chamber 2. The opposing wall 2d of the reaction chamber 2 is in the embodiment shown in FIG. 1 the ceiling of the reaction chamber 2. It may however be also the bottom of the reaction chamber 2 when the substrate support 2c is arranged on top part of the reaction chamber 2, i.e. to the ceiling or near the ceiling.

The reaction space 3 inside the reaction chamber 2 is defined such that the reaction space 3 is between the first end 2a and the second end 2b and between the substrate support 2c and the opposing wall 2d. In other words the reaction chamber 2 is the outer dimensions of the reaction space 3 and defined by the walls of the reaction chamber 2.

A plasma discharge electrode 4 is provided in connection with the opposing wall 2d between the first end 2a and the second end 2b at a first distance a from the first end 2a and at a second distance b from the second end 2b. In FIG. 1 the plasma discharge electrode 4 is provided in connection with the ceiling of the reaction chamber 2 because the substrate support 2c is at the bottom of the reaction chamber 2. However the plasma discharge electrode 4 may also be provided in connection with the bottom of the reaction chamber 2, when the substrate support 2c is at the top part of the reaction chamber 2 or in connection with the ceiling of the reaction chamber 2. In both cases the plasma discharge electrode is arranged such that it extends between a first distance a from the first end 2a and a second distance b from the second end 2b.

A reaction zone 5 (shown with a crosshatched area in the figure) is provided between the first distance a from the first end 2a and the second distance b from the second end 2b and between the plasma discharge electrode 4 and the substrate support 2c. In other words the reaction zone 5 is defined by the plasma discharge electrode 4 and the height of the reaction chamber 2.

The apparatus further comprises a precursor supply controlling device 13 for controlling the amount of the first precursor. The precursor supply controlling device 13 preferably comprises a valve for releasing specific amount of the first precursor and a regulating member for automatically regulating the open/closed state of the valve. In another embodiment of the invention the precursor supply controlling device 13 comprises a valve and a controlling device for controlling the valve.

According to the method of the invention in the step of arranging the substrate 1 to the substrate support 2c in the reaction zone 5, the substrate 1 is in the embodiment of FIG. 1 arranged on the bottom of the reaction chamber 2 in the area in which the plasma discharge electrode 4 reacts. This means that the substrate 1 is arranged in the area defined between at least a distance a from the first end 2a and a distance b from the second end 2b. The step of supplying a predetermined amount of the first precursor via the gas inlet 20 to the reaction chamber 2 for providing a flow of the first precursor to the reaction zone 5 such that the first precursor is depleted by the end of the second end 2b means that the controlling device 13 controls the amount of the first precursor to be such that by the end of the second end 2b, i.e. before the gas outlet 21, the first precursor depletes such that there is no first precursor to be discharged through the gas outlet 21. The first precursor can comprise e.g. trimethylaluminium (TMA).

The step of supplying second precursor via the gas inlet 20 to the reaction chamber 2 for providing a flow of the second precursor through the reaction zone 5 and discharging the second precursor from the reaction chamber 2 via the gas outlet 21 means that the second precursor is arranged to flow through the reaction chamber 2. The second precursor is inactive to react with the first precursor. The second precursor can comprise e.g. oxygen (02).

The step of generating plasma discharge to the reaction zone 5 with the plasma discharge electrode 4 for forming active precursor radicals from the second precursor supplied into the reaction zone 5 during the flow of the second precursor through the reaction zone 5, the active precursor radicals being active to react with the first precursor means that in the area of the reaction zone 5 the coating is applied to the surface of the substrate 1 and in case the substrate 1 is smaller than the reaction zone area also to the bottom of the reaction zone 5.

So the substrate 1 is coated in the reaction zone 5 and the precursors react together forming a film only in the reaction zone 5 such that outside the reaction zone 5 the precursors do not react together and no film is created to surfaces of the reaction chamber 2 or to the gas outlet 21.

In order to make sure that the first precursor depletes by the end of the second end 2b a step of determining the predetermined amount of the first precursor is performed.

In order to determine the right amount the first precursor such that it depletes by the end of the second end 2b the steps of measuring concentration of the first precursor downstream of the reaction zone 5 and adjusting the predetermined amount of the first precursor based on the measurement of the concentration of the first precursor downstream of the reaction zone 5 can be performed in which the first precursor is preferably measured by a sensor arranged to sense concentration of the first precursor in an area between the reaction zone 5 and the second end 2b. A threshold value for the concentration can be determined and if the concentration is above the threshold value the controlling device decreases the predetermined amount of the first precursor. So the method comprises a step of adjusting the predetermined amount of the first precursor such that it is depeleted by the end of the second end 2b.

Another way to determine the right amount of first precursor is to perform an underdose test for determining the predetermined amount of the first precursor. The reaction chamber 2 may comprise a sacrificial member 11 arranged in the reaction chamber 2 in an area between the reaction zone 5 and the second end 2b for detecting concentration of the first precursor. The sacrificial member 11 is a planar member arranged in an area between the substrate 1 and the second end 2b of the reaction chamber 2. So the sacrificial member 11 is preferably an extension piece for the substrate 1 although not necessarily an immediate extension so that there may be a gap between the substrate 1 and the sacrificial member 11. The sacrificial member 11 is in most preferable embodiment of the invention a planar member which is arranged in the same direction to the reaction chamber 2 as the substrate 1. The sacrificial member 11 is a removable part such that the sacrificial member 11 can be removed from the apparatus without breaking a vacuum in the reaction chamber 2. The removable part in the context of this application means that the part is removable without disassembling the apparatus. The part is removable during normal operation condition of the apparatus e.g. for a cleaning purpose or for other maintenance of the part or for changing the part for a new one. The removable part is preferably removable during the loading position of the apparatus and not in the process position of the apparatus. The apparatus comprises a loading device for loading the substrate 1 and/or the sacrificial member 11. The sacrificial member 11 may be removed from the apparatus with the loading device that is movable preferably in a vertical direction for moving the sacrificial member 11 between a process position and a loading position. The loading device may also move the substrate between a process position and a loading position.

Although FIG. 1 shows both the sensor 12 and the sacrificial member 11 they both need not to be present in the same apparatus or at the same time. When the sacrificial member 11 is used there is no need for a sensor 12 and vice versa.

Purge gas may be supplied via the gas inlet 20 to the reaction chamber 2 and through the reaction chamber 2 to be discharged through the gas outlet 21. The method comprises a step of supplying purge gas precursor via the gas inlet 20 to the reaction chamber 2 for providing a purge gas flow through the reaction zone 5 and discharging the purge gas from the reaction chamber 2 via the gas outlet 21.

Figure 2:
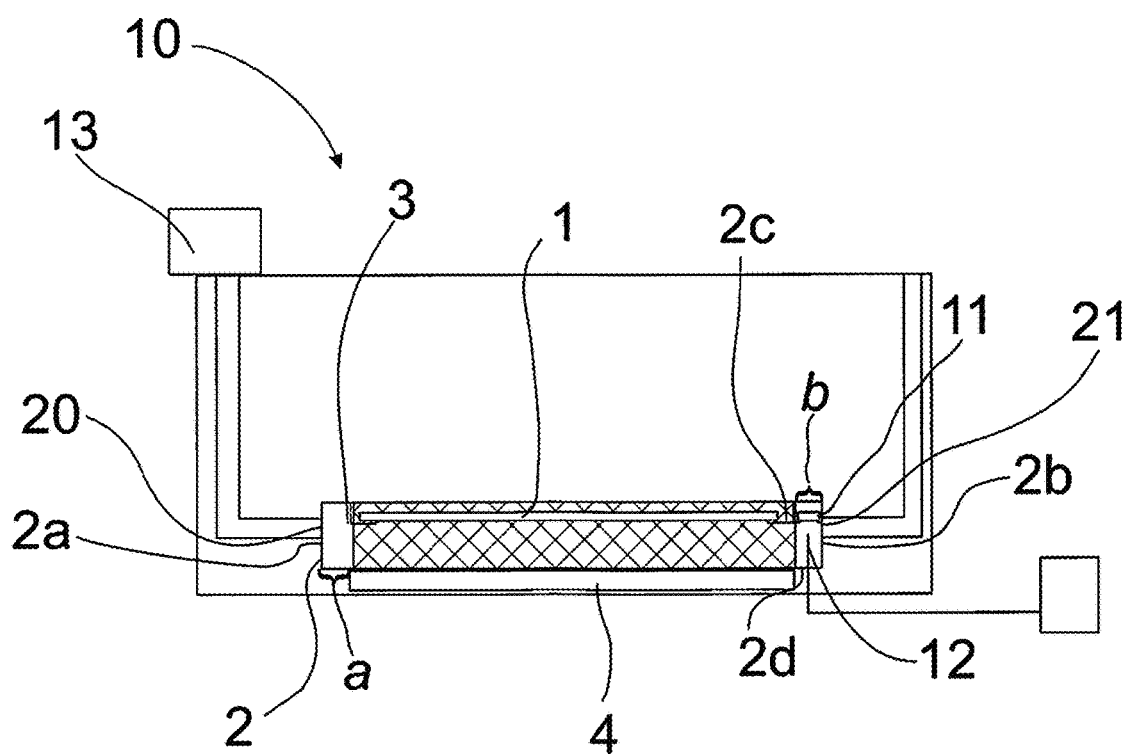
FIG. 2 shows a second embodiment of the apparatus for coating a substrate according to the invention.

FIG. 2 shown an embodiment of the apparatus in which the apparatus 10 comprises a reaction chamber 2 and the reaction chamber 2 comprises a first end 2a having a gas inlet 20 for providing precursor to the reaction chamber 2, a second end 2b having a gas outlet 21 for discharging precursor from the reaction chamber 2, a substrate support 2c for holding a substrate 1, an opposing wall 2d opposite to the substrate support 2c, the substrate support 2c and the opposing wall 2d extending between the first end 2a and the second end 2b. As in the embodiment of FIG. 1 the reaction chamber 2 is preferably low in height and wide in length which means that the reaction chamber is flat-like in a horizontal direction. The gas inlet 20 is preferably arranged such that the precursor supplied through the gas inlet 20 is directed to the reaction chamber 2 in a substantially horizontal flow direction and the gas outlet 21 is also preferably arranged such that the precursor discharged from the reaction chamber 2 is discharged in a substantially horizontal flow direction. The gas inlet 20 and the gas outlet 21 are arranged such that the flow direction of the precursors flowing through the reaction chamber 2 is substantially horizontal. In this embodiment the substrate support 2c is arranged on the top part of the reaction chamber 2. The opposing wall 2d of the reaction chamber 2 is in this embodiment the bottom of the reaction chamber 2. In this embodiment the substrate support 2c is arranged such that the substrate 1 is not in contact with the ceiling of the reaction chamber 2. However, the substrate 1 may also be arranged in the substrate support 2c such that there is no space between the ceiling of the reaction chamber and the substrate 1 or the substrate support 2c may be connected to the ceiling of the reaction chamber 2.

It will be obvious to a person skilled in the art that, as the technology advances, the inventive concept can be implemented in various ways. The invention and its embodiments are not limited to the examples described above but may vary within the scope of the claims.

The invention claimed is:

1. A method of coating a substrate by subjecting a surface of the substrate to successive surface reactions of a first precursor and a second precursor according to the principles of atomic layer deposition in a reaction chamber, said reaction chamber comprising:
   a first end having a gas inlet for providing precursor to the reaction chamber;
   a second end having a gas outlet for discharging precursor from the reaction chamber;
   a substrate support for holding the substrate;

an opposing wall opposite to the substrate support, the substrate support and the opposing wall extending between the first end and the second end;
a reaction space inside the reaction chamber defined between the first end and the second end and between the substrate support and the opposing wall;
a plasma discharge electrode provided in connection with the opposing wall between the first end and the second end at a first distance from the first end and at a second distance from the second end; and
a reaction zone provided between the first distance from the first end and the second distance from the second end and between the plasma discharge electrode and the substrate support;
the method comprising:
arranging the substrate to the substrate support in the reaction zone;
supplying a predetermined amount of the first precursor via the gas inlet to the reaction chamber for providing a flow of the first precursor to the reaction zone such that the first precursor is depleted by the end of the second end;
supplying the second precursor via the gas inlet to the reaction chamber for providing a flow of the second precursor through the reaction zone and discharging the second precursor from the reaction chamber via the gas outlet, the second precursor being inactive to react with the first precursor;
generating plasma discharge to the reaction zone with the plasma discharge electrode for forming active precursor radicals from the second precursor supplied into the reaction zone during the flow of the second precursor through the reaction zone, the active precursor radicals being active to react with the first precursor using a sacrificial member arranged in the reaction chamber in an area between the reaction zone and the second end for detecting concentration of the first precursor.

2. The method according to claim 1, wherein the method further comprises a step of determining the predetermined amount of the first precursor.

3. The method according to claim 2, wherein the method further comprises a step of performing an underdose test for determining the predetermined amount of the first precursor.

4. The method according to claim 2, wherein the step of determining the predetermined amount of the first precursor comprises:
measuring concentration of the first precursor downstream of the reaction zone; and
adjusting the predetermined amount of the first precursor based on the measurement of the concentration of the first precursor downstream of the reaction zone.

5. The method according to claim 1, wherein the method further comprises a step of adjusting the predetermined amount of the first precursor such that it is depleted by the end of the second end.

6. The method according to claim 1, wherein the method further comprises a step of supplying said first and second precursor in a horizontal direction to the reaction chamber.

7. The method according to claim 1, wherein the method further comprises a step of supplying purge gas precursor via the gas inlet to the reaction chamber for providing a purge gas flow through the reaction zone and discharging the purge gas from the reaction chamber via the gas outlet.

8. An apparatus for coating a substrate by subjecting a surface of the substrate to successive surface reactions of a first precursor and a second precursor according to the principles of atomic layer deposition in a reaction chamber, the apparatus comprising said reaction chamber and the reaction chamber comprising:
a first end having a gas inlet for providing precursor to the reaction chamber
a second end having a gas outlet for discharging precursor from the reaction chamber
a substrate support for holding the substrate;
an opposing wall opposite to the substrate support, the substrate support and the opposing wall extending between the first end and the second end;
a reaction space inside the reaction chamber defined between the first end and the second end and between the substrate support and the opposing wall;
a plasma discharge electrode provided in connection with the opposing wall between the first end and the second end at a first distance from the first end and at a second distance from the second end;
a reaction zone provided between the first distance from the first end and the second distance from the second end and between the plasma discharge electrode and the substrate support; and
a sacrificial member arranged in the reaction chamber in an area between the reaction zone and the second end for detecting concentration of the first precursor.

9. The apparatus according to claim 8, wherein the sacrificial member is a planar member arranged between the substrate and the second end in the reaction chamber.

10. The apparatus according to claim 8, wherein the sacrificial member is a removable part such that the sacrificial member can be removed from the apparatus without breaking a vacuum in the reaction chamber.

11. The apparatus according to claim 8, wherein the apparatus further comprises a loading device for loading the substrate and/or the sacrificial member.

12. The apparatus according to claim 8, wherein the apparatus further comprises a precursor supply controlling device for controlling the amount of the first precursor.

13. The apparatus according to claim 8, wherein the apparatus further comprises a sensor arranged to sense concentration of the first precursor in an area between the reaction zone and the second end.

* * * * *